(12) United States Patent
Stathakis

(10) Patent No.: US 7,151,668 B1
(45) Date of Patent: Dec. 19, 2006

(54) MEMORY HEAT SINK

(75) Inventor: D. George Stathakis, Sedalia, CO (US)

(73) Assignee: Muskin, Inc., Denver, CO (US)

( * ) Notice: Subject to any disclaimer, the term of this patent is extended or adjusted under 35 U.S.C. 154(b) by 46 days.

(21) Appl. No.: 10/904,980

(22) Filed: Dec. 8, 2004

Related U.S. Application Data

(63) Continuation-in-part of application No. 29/216,013, filed on Oct. 28, 2004.

(51) Int. Cl.
   *H05K 7/20* (2006.01)
(52) U.S. Cl. ............... 361/700; 361/701; 361/719; 257/715; 165/80.4; 165/104.26
(58) Field of Classification Search ........... 361/687, 361/690–697, 698–699, 700–704, 707–712, 361/714–719; 257/706–727; 174/15.1, 174/16.3, 250, 52.1; 165/80.3, 185, 104.32, 165/104.33, 104.21, 104.26
See application file for complete search history.

(56) References Cited

U.S. PATENT DOCUMENTS

| | | | | |
|---|---|---|---|---|
| 5,224,538 A * | 7/1993 | Jacoby | ............... | 165/166 |
| 6,025,992 A * | 2/2000 | Dodge et al. | ............... | 361/704 |
| 6,319,756 B1 * | 11/2001 | Duesman et al. | ............ | 438/122 |
| 6,349,035 B1 * | 2/2002 | Koenen | ................ | 361/719 |
| 6,483,702 B1 * | 11/2002 | Lofland | ................ | 361/704 |
| 6,496,375 B1 * | 12/2002 | Patel et al. | ............... | 361/719 |
| 6,535,387 B1 * | 3/2003 | Summers et al. | ............ | 361/704 |
| 6,760,222 B1 | 7/2004 | Wang | ................ | 361/700 |
| 6,765,797 B1 * | 7/2004 | Summers et al. | ............ | 361/704 |
| 6,807,058 B1 | 10/2004 | Matteson et al. | ............ | 361/700 |
| 6,937,474 B1 * | 8/2005 | Lee | ............... | 361/715 |
| 7,025,701 B1 * | 4/2006 | Cui et al. | ............... | 475/159 |
| 2006/0056154 A1 * | 3/2006 | Foster et al. | ............... | 361/700 |

OTHER PUBLICATIONS

Article: "Water-Enhanced Selective Module Cooling for Air-Cooled Circuit Cards", IBM Technical Disclosure Bulletin, Jun. 1985, US. vol. 28, Issue 1, Pabes 110-114.*

* cited by examiner

*Primary Examiner*—Michael Datskovskiy
(74) *Attorney, Agent, or Firm*—Holland & Hart LLP

(57) ABSTRACT

An apparatus is provided for dissipating heat from a semiconductor device that meets dimensional requirements for the semiconductor device and provides enhanced cooling for the semiconductor device. The apparatus provides a relatively large surface area for transferring heat away from a semiconductor device, and provides for enhanced coolant flow through or around the apparatus. The apparatus includes a channel that may accommodate a heat pipe to further enhance transfer of heat away from the semiconductor device.

20 Claims, 2 Drawing Sheets

MEMORY HEAT SINK

CROSS REFERENCE TO RELATED APPLICATIONS

This application is a continuation-in-part of pending U.S. patent application Ser. No. 29/216,013, filed on Oct. 28, 2004, titled MEMORY CARD HEAT SINK, incorporated herein by reference as if set out in full.

FIELD OF THE INVENTION

The present invention is directed to heat dissipation devices and, more specifically, to a heat spreading device for a memory component of a computing system.

BACKGROUND

The generation of heat within semiconductor packages for devices such as microprocessors and memories has long been recognized as a significant source of operating errors of such semiconductor devices. Operating errors may result from, for example, components within the semiconductor not functioning properly due to operating temperatures becoming too high. For example, a transistor within a device may be nominally switched into an "on" state upon the application of a preset voltage. However, if the transistor is operating at a sufficiently high operating temperature, it may be switched on at a lower voltage, resulting in an operating error within the device.

One method for reducing the heat within such a semiconductor device includes placing a heat dissipating device into contact with the semiconductor device. Such heat dissipating devices commonly are made of material having a high thermal conductivity through which heat is dissipated away from the semiconductor device. For example, it is common for a microprocessor to have a heat sink made of metal and having a number of fins thereon placed into contact with the packaging of the microprocessor. Heat generated in the microprocessor is transmitted through the device packaging, conventionally made of thermally conductive ceramic material, and into the heat sink, where it is conducted away from the microprocessor and dissipated through the fins. It is also common for such heat sinks to have a fan associated therewith, facilitating air flow and further enhancing heat dissipation.

As technology has progressed, heat loads generated from semiconductor devices have risen, resulting in increased need for heat dissipation. Furthermore, space allowances within devices housing the semiconductor components have compressed. Thus problems arise in effectuating the necessary transfers of heat from increasingly confined spaces. For example, heat loads from a typical microprocessor exceed seventy-five watts, while space allowances have shrunk to limit the available height for a heat sink to less than forty millimeters. Furthermore, other components may have even smaller space allowances, such as memory components that may be placed into in-line slots. The maximum width for such a memory component is limited by the space between in-line slots, resulting in a relatively small space allowance and little room for heat dissipation devices. Similarly, many components may be placed on, for example, peripheral component interconnect boards that are placed into in-line PCI slots, resulting in relatively small space allowances for semiconductor components placed on the PCI board.

SUMMARY OF THE INVENTION

The present invention provides an apparatus for dissipating heat from a semiconductor device that meets dimensional requirements for the semiconductor device. The apparatus provides a relatively large surface area for transferring heat away from a semiconductor device, and provides for enhanced coolant flow through or around the apparatus.

In one embodiment, an apparatus for transferring heat away from an electronic device having at least one heat generating component is provided. The apparatus comprises a channel of heat transferring material. The channel has first and second flanges along the length thereof, with a first rectilinear body of heat transferring material affixed to the first flange. A second rectilinear body of heat transferring material is affixed to the second flange. The first and second rectilinear bodies are operable to be positioned substantially parallel to one another and a space between the first and second rectilinear bodies is adapted to receive the electronic device. One or both of the rectilinear bodies contacts a surface of the heat generating component, and transmits heat away from the heat generating component. In one embodiment, the channel is spaced apart from the electronic device to allow air to access both an inner surface and an outer surface of the channel. The channel may include a plurality of openings therein to further facilitate the exchange of air through the channel. The channel may also be flared relative to the first and second rectilinear bodies providing additional surface area for the exchange of heat. Furthermore, one or both of the rectilinear bodies may include surface relief features providing a total surface area of the rectilinear body that is greater than the planar area of the rectilinear body. The surface relief features may include fins, depressions, and/or grooves. In another embodiment, the channel is adapted to receive a heat pipe. The heat pipe is interconnected to a cool fluid supply, resulting in cool fluid passing through the heat pipe and further facilitating the transfer of heat away from the electronic component. The heat generating component may include a memory device or other semiconductor component.

Another embodiment of the present invention provides an apparatus comprising a heat releasing semiconductor package, and a heat sink engaging the semiconductor package to transfer heat therefrom. The heat sink includes a channel of heat transferring material, a first flange along a length thereof, and a second flange along the length thereof spaced apart from the first flange. A first rectilinear body of heat transferring material is affixed to the first flange, and a second rectilinear body of heat transferring material is affixed to the second flange. The first and second rectilinear bodies are substantially parallel to one another, and the heat releasing semiconductor package is located in a space between the first and second rectilinear bodies. The channel is spaced apart from the heat releasing semiconductor package to allow air to access both an inner surface and an outer surface of the channel.

In yet another embodiment, a computer related apparatus is provided comprising a computer main board, a heat releasing module interconnected with the computer main board, and a heat sink engaging the heat releasing module to transfer heat therefrom. The heat sink comprises a channel of heat transferring material, a first flange along a length thereof, and a second flange along the length thereof spaced apart from the first flange. A first rectilinear body of heat transferring material is affixed to the first flange, and a second rectilinear body of heat transferring material is affixed to the second flange. The first and second rectilinear bodies are substantially parallel to one another and the heat releasing module is located in a space between the first and second rectilinear bodies. The heat sink includes a heat pipe interconnected to the channel and a fluid supply operably interconnected to the heat pipe to provide a cool fluid to the heat pipe. One or both of the rectilinear bodies includes surface relief features providing a total surface area of the rectilinear body that is greater than the planar area of the rectilinear body. The surface relief features may include fins, depressions and/or grooves.

DETAILED DESCRIPTION

While the present invention is described with reference to the accompanying drawings, in which one embodiment of the present invention is illustrated, it is to be understood at the outset that persons of skill in the appropriate arts may modify the invention here described while still achieving the favorable results of the invention. Accordingly, the description that follows is to be understood as being a broad disclosure directed to persons of skill in the appropriate arts, and not as limiting upon the present invention.

Figure 1:
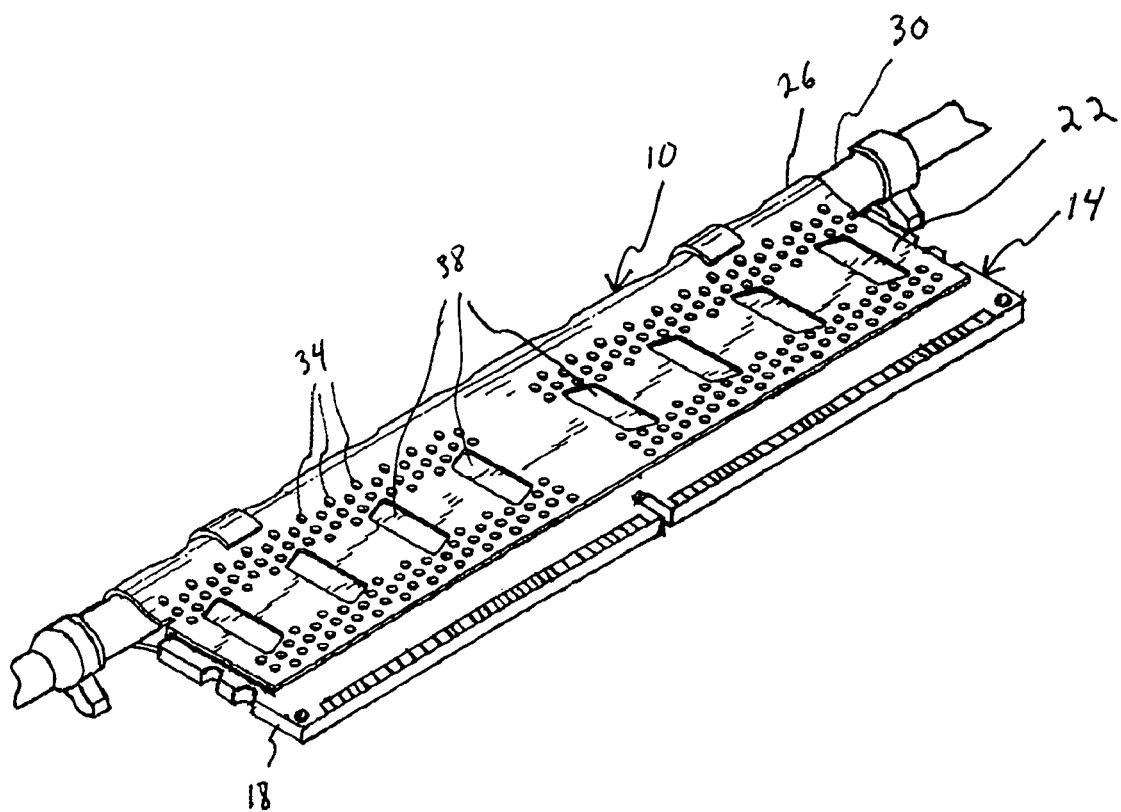
FIG. 1 is a perspective view of a heat sink and memory device of an embodiment of the present invention.

Referring now FIG. 1, a perspective view of a heat sink 10 of an embodiment of the present invention is described. The heat sink 10 of this embodiment is configured to provide heat dissipation from a memory device 14. As is well known, such a memory device 14 may include, for example, a single inline memory module (SIMM), or a dual inline memory module (DIMM). The memory device 14 includes a number of semiconductor memory components (not shown) on one or both sides of a printed circuit board 18. The memory device 14 is inserted into a corresponding receiving slot in a computer main board and may be used to store data as required. In the embodiment of FIG. 1, the heat sink 10 is configured to be secured with a memory device 14 by placing the memory device 14 between two spaced apart heat conducting rectilinear bodies 22. The rectilinear bodies 22 are connected to a channel 26 that extends beyond the top portion of the printed circuit board 18 of the memory device 14. In this embodiment, the channel is flared outward from the surface of the memory device 14, providing a channel 26 having a tubular cross-section. The rectilinear bodies 22 and channel 26, in this embodiment, are formed of an integral piece of heat conducting material such as, for example, copper or aluminum. Furthermore, in the embodiment of FIG. 1, a heat pipe 30 is located within the channel 26. A cool fluid, such as a cooled gas or cooled liquid, may be supplied to the heat pipe 30 in order to transfer heat away from the heat sink 10. The rectilinear bodies 22, as illustrated in FIG. 1, may also have surface features including a number of dimples 34 and/or grooves 38. These surface features provide additional surface area to provide further heat dissipation ability for the heat sink 10. Additionally, the flared channel 26 of this embodiment provides additional surface area through which heat may be transferred away from the heat sink 10.

Figure 2:
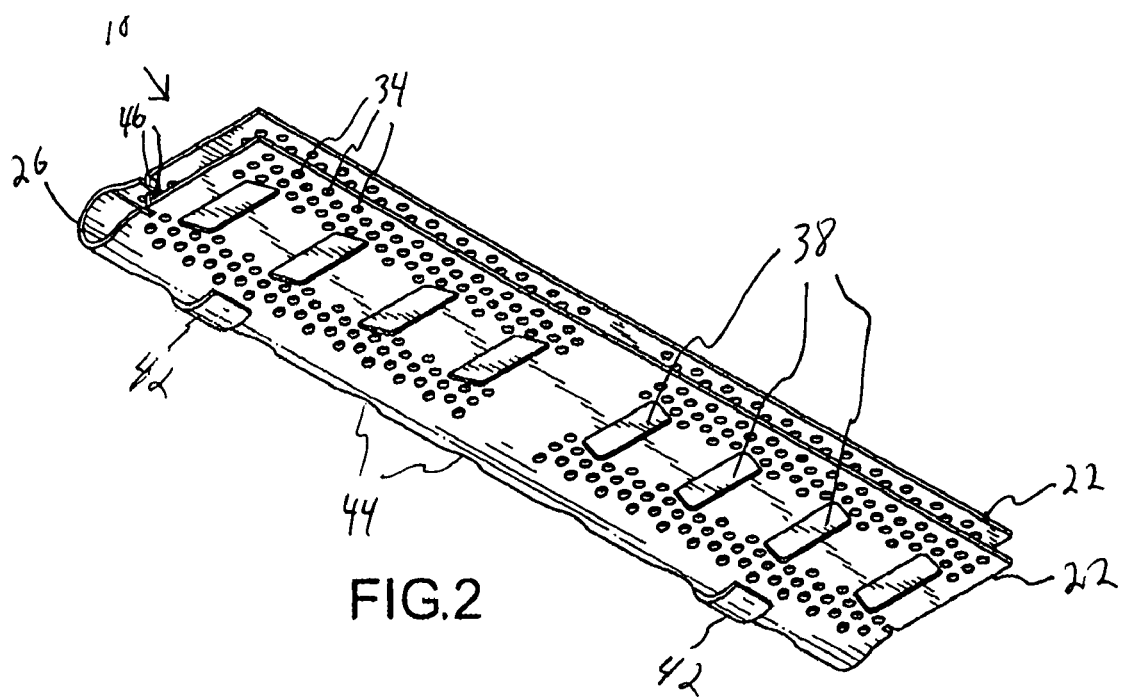
FIG. 2 is a perspective view of a heat sink of an embodiment of the invention.

With reference now to FIG. 2, a perspective view of the heat sink 10, without an associated memory device or heat pipe is illustrated. As illustrated in FIG. 1, the rectilinear surfaces 22 are connected to the channel 26 extending therefrom substantially parallel to provide an area into which a memory device may be inserted. The rectilinear bodies 22 are connected to the channel 26 in this embodiment such that the channel 26 body applies some amount of biasing force to force each rectilinear body 22 towards the other when a memory device is inserted between the rectilinear bodies 22. In this manner, the rectilinear bodies 22 contact the semiconductor memory components that are mounted on the memory device. The semiconductor memory components, as is well understood, generate heat during operation, and the contact of the rectilinear bodies 22 to the semiconductor memory promotes the transfer of heat away from the semiconductor memory. In another embodiment, clips 42 are secured over the channel 26 to provide additional biasing toward the semiconductor memory. The channel 26, in this embodiment, also has a number of openings 44 that further help facilitate air flow between the interior surface of the channel 26 and the exterior of the channel 26.

Figure 3:
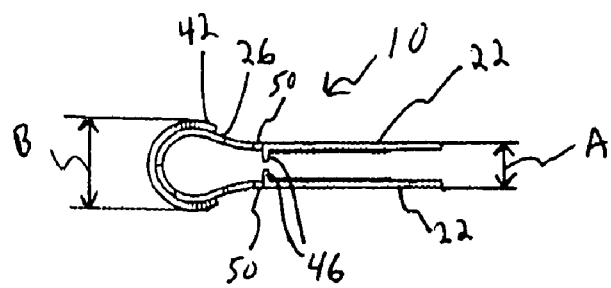
FIG. 3 is an end elevation view of a heat sink of an embodiment of the invention.

FIG. 3 illustrates an end elevation view of the heat sink 10. The heat sink 10, as can be observed by this illustration, further includes tabs 46 that provide a stop for the memory device 14 when it is inserted into the heat sink 10. The tabs 46 thus provide a guide for assembly of the heat sink 10 to a memory device 14, helping to provide a correct placement of the heat sink 10 relative to the memory device 14. The proper placement of the memory and heat sink 10 help provide heat dissipation while not interfering with the insertion of the memory device 14 into a receiving slot. As illustrated in FIG. 3, the channel 26 also has flanges 50, with the rectilinear bodies 22 integrally connected to the flanges 50. The channel 26 extends from the flanges 50 flares outward and provides a relatively large open area to facilitate air flow or, alternatively, that may accommodate the heat pipe 30 described with respect to FIG. 1.

With continuing reference to FIG. 3, the dimensions of the heat sink 14 are such that adjacent memory devices having a heat sink 14 affixed thereto may be located in adjacent memory slots within a computing device. In this embodiment, the width A of the rectilinear bodies 22 is approximately 6 mm, and the maximum width B of the flared channel 26 is approximately 7.5 mm. In this manner, the heat sink 14 may be affixed to a memory device 14 while still allowing the memory device 14 to conform to maximum space requirements for such components within a standard computing system.

Figure 4:
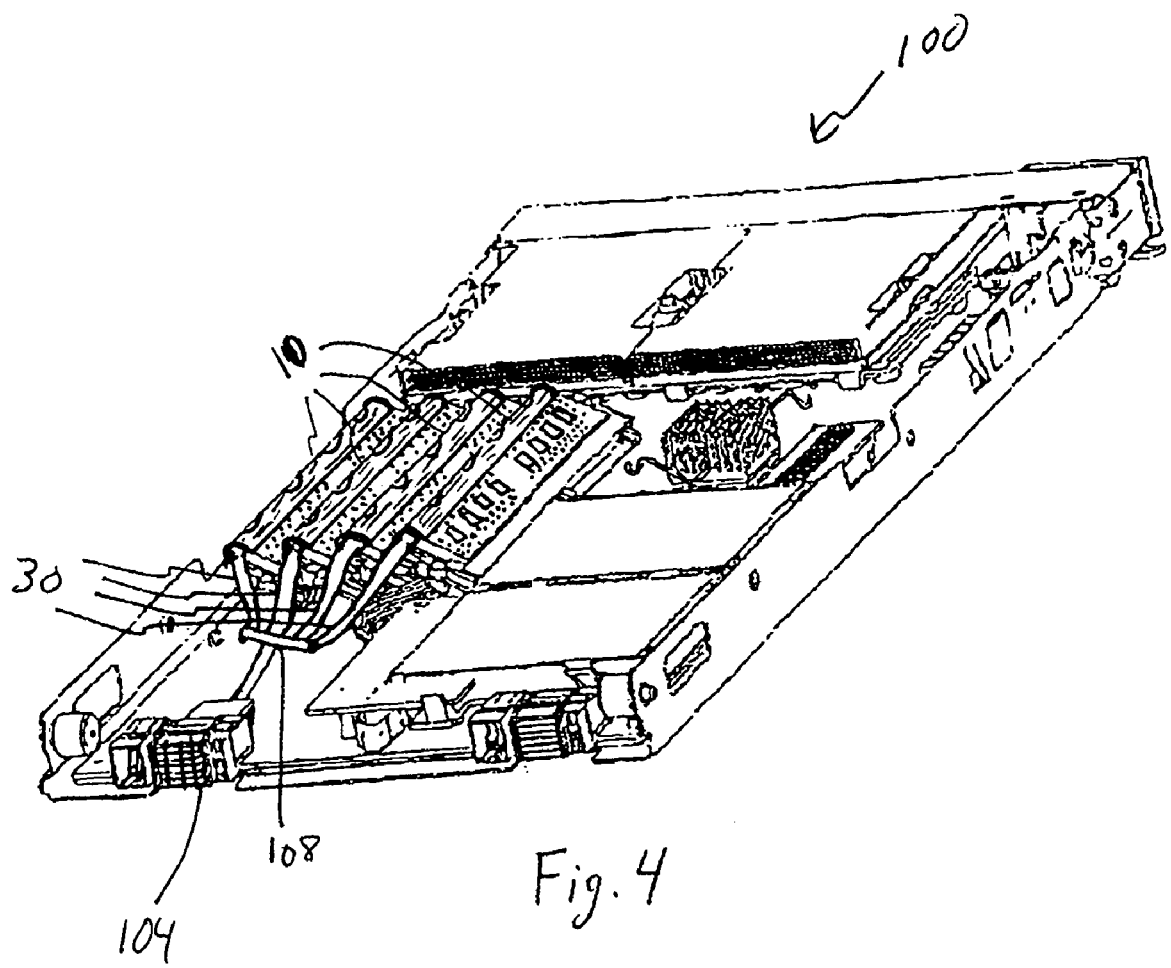
FIG. 4 is an illustration of a computer main board and memory devices with heat sinks of an embodiment of the invention.

With reference now to FIG. 4, one application of a heat sink of the present invention is illustrated. In this example, a computing main board 100 has a number of memory devices 14 with associated heat sinks 10. In this embodiment, the memory devices 14 are located in adjacent memory slots within the computing main board 100. Heat sinks 10 are affixed to the memory devices 14, and heat pipes 30 are located within the channels 26 of the heat sinks 10. The heat pipes 30 are coupled to a fan 104 that provides air flow to the heat pipes 30 through a manifold 108, thus providing for additional heat transfer capability to transfer heat away from the memory devices. As will be understood, numerous applications exist in which a heat sink of the present invention may be used. Additionally, a heat pipe 30 may be used to transmit a liquid coolant through channel 26 of a heat sink 10, rather than air or other gas. Similarly, the channel 26 may contain a material that is able to absorb a significant amount of heat energy, such as a phase change material.

While the invention has been particularly shown and described with reference to a preferred embodiment thereof, it will be understood by those skilled in the art that various other changes in the form and details may be made without departing from the spirit and scope of the invention.

What is claimed is:

1. An apparatus for transferring heat away from an electronic device having at least one heat generating component, comprising:
    a channel comprising heat transferring material and having first and second flanges along the length of said channel;
    a first rectilinear body of heat transferring material integrally connected to said first flange;
    a second rectilinear body of heat transferring material integrally connected to said second flange, wherein said first and second rectilinear bodies are operable to be positioned substantially parallel to one another and a space between said first and second rectilinear bodies is adapted to receive the electronic device with at least one of said rectilinear bodies contacting a surface of at least one heat generating component; and
    a heat pipe residing in said channel.

2. The apparatus for transferring heat away from an electronic device, as claimed in claim 1, wherein said channel is spaced apart from the electronic device, when the electronic device is engaged with said first and second rectilinear bodies, to allow air to access both an inner surface and an outer surface of said channel.

3. The apparatus for transferring heat away from an electronic device, as claimed in claim 2, wherein said channel includes a plurality of openings therein.

4. The apparatus for transferring heat away from an electronic device, as claimed in claim 1, wherein said channel is flared relative to said first and second rectilinear bodies.

5. The apparatus for transferring heat away from an electronic device, as claimed in claim 1, wherein said first rectilinear body comprises surface relief features providing a total surface area of said first rectilinear body that is greater than the planar area of said first rectilinear body.

6. The apparatus for transferring heat away from an electronic device, as claimed in claim 5, wherein said surface relief features comprise a plurality of grooves within over an area that is less than the entire area of said first rectilinear body.

7. The apparatus for transferring heat away from an electronic device, as claimed in claim 5, wherein said surface relief features comprise a plurality of dimples within an area that is less than the entire area of said first rectilinear body.

8. The apparatus for transferring heat away from an electronic device, as claimed in claim 1, wherein said rectilinear bodies comprise a plate of a metal having high thermal conductivity.

9. The apparatus for transferring heat away from an electronic device, as claimed in claim 1, wherein the heat pipe is operably interconnected to a cool fluid supply.

10. The apparatus for transferring heat away from an electronic device, as claimed in claim 1, wherein the at least one heat generating component includes a memory device.

11. The apparatus for transferring heat away from an electronic device, as claimed in claim 9, wherein the cool fluid supply is a gas.

12. An apparatus comprising:
    a heat releasing semiconductor package; and
    a heat sink engaging said semiconductor package to transfer heat therefrom, said heat sink comprising:
        a channel comprising heat transferring material, a first flange along a length thereof, and a second flange along the length thereof spaced apart from said first flange;
        a first rectilinear body of heat transferring material integrally connected to said first flange;
        a second rectilinear body of heat transferring material integrally connected to said second flange,
        at least the first rectilinear body comprises surface relief features over at least a substantial majority of a total surface area of said first rectilinear body to provide the total surface area of said first rectilinear body that is greater than the planar area of said first rectilinear body, wherein said first and second rectilinear bodies are substantially parallel to one another and said heat releasing semiconductor package is located in a space between said first and second rectilinear bodies; and
    a heat pipe residing in said channel.

13. The apparatus of claim 12, wherein said channel is spaced apart from the heat releasing semiconductor package to allow air to access both an inner surface and an outer surface of said channel.

14. The apparatus of claim 12, wherein said channel is flared relative to said first and second flanges.

15. The apparatus of claim 12, wherein said surface relief features comprise a plurality of grooves within an area that is less than the entire area of said first rectilinear body.

16. The apparatus of claim 12, wherein said surface relief features comprise a plurality of dimples within an area that is less than the entire area of said first rectilinear body.

17. The apparatus of claim 12, wherein said rectilinear bodies comprise a plate of a metal having high thermal conductivity.

18. The apparatus of claim 12, wherein said heat pipe is operably interconnected to a cool fluid supply.

19. The apparatus of claim 12, wherein said heat releasing semiconductor package comprises a memory device.

20. The apparatus of claim 18, wherein the cool fluid supply is a gas.

* * * * *